United States Patent [19]

Hinshaw

[11] Patent Number: 4,468,621
[45] Date of Patent: Aug. 28, 1984

[54] INVESTIGATION OF SAMPLES BY N.M.R. TECHNIQUES

[75] Inventor: Waldo S. Hinshaw, Richmond Heights, Ohio

[73] Assignee: National Research Development Corporation, London, England

[21] Appl. No.: 341,175

[22] Filed: Jan. 20, 1982

[51] Int. Cl.³ ............................................. G01R 33/08
[52] U.S. Cl. .................................... 324/309; 324/307
[58] Field of Search ............... 324/300, 307, 309, 312, 324/313

[56] References Cited

U.S. PATENT DOCUMENTS 4,015,196 3/1977 Moore et al.
4,184,110 1/1980 Hinshaw .
4,319,190 3/1982 Brown ................................ 324/309

FOREIGN PATENT DOCUMENTS 1508438 4/1978 United Kingdom .
1601816 11/1981 United Kingdom .

OTHER PUBLICATIONS

P. C. Lauterbur, "Image Formation by Induced Local Interactions: Examples Employing Nuclear Magnetic Resonance," from Nature, vol. 242, Mar. 16, 1973, pp. 190 and 191.

Primary Examiner—Michael J. Tokar
Attorney, Agent, or Firm—Cushman, Darby & Cushman

[57] ABSTRACT

Spatially discriminated information is obtained by appropriate processing of data derived from a series of pulsed N.M.R. operations performed with a magnetic field exhibiting a linear gradient whose magnitude is different for each operation. In obtaining a two-dimensional image of spin density distribution, coil sets (5 and 6) are used to generate magnetic field components giving x and y gradients, the former being changed stepwise in magnitude and the latter being fixed. For each value of x gradient, the sample (1) is irradiated with pulsed r.f. energy, resultant N.M.R. signals being detected by phase-sensitive detectors (19 and 20) whose outputs are regularly sampled by A-D converters (25 and 26). Processing of the complete sampled data by a computer (12) involves both Fourier transformation with respect to x gradient magnitude and Fourier transformation with respect to time. For sectional images a third coil set (7) is used to generate a component giving an alternating z gradient and the irradiation consists of a train of pulses.

8 Claims, 6 Drawing Figures

INVESTIGATION OF SAMPLES BY N.M.R. TECHNIQUES

This invention relates to the investigation of samples by means of nuclear magnetic resonance (N.M.R.) techniques.

In conventional experiments using such techniques the results obtained relate to the average properties of a sample under investigation, but in recent times considerable attention has been directed to methods by means of which the properties of different parts of a sample may be individually distinguished, thereby making it possible for example to obtain information relating to the distribution within an inhomogeneous sample of the values of parameters such as nuclear spin density and nuclear spin relaxation time. Broadly speaking, such methods are based on two different principles (which can, however, be used in combination in specific cases). The first of these, which may conveniently be referred to as spatial selection, involves arranging the N.M.R. system so that only signals from a selected region of the sample are received or processed; for an example of a method based on the spatial selection principle reference may be made to British Patent Specification No. 1,508,438 and U.S. Pat. No. 4,015,196. The other principle, which may conveniently be referred to as signal coding, involves arranging the N.M.R. system so that the signals received from the sample contain distinguishable information about different parts of the sample (or different parts of a region of the sample selected using the spatial selection principle).

Various methods of producing images of a sample using the signal coding principle have been proposed, but they generally have the disadvantage, which is particularly marked in the case of large samples, of imposing very severe practical requirements in respect of one or more aspects of the N.M.R. system. Thus in some cases the methods require very rapid changes to be made in some component of the magnetic field applied to the sample, often with a requirement that the field throughout the sample should be stable in a short time after the change; in other cases the formation of a satisfactory image is dependent upon very accurate control of the magnetic field applied to the sample. The latter consideration applies, for example, to the method disclosed by Lauterbur in Nature, Vol. 242, 16 March 1973, pages 190–191, in which N.M.R. spectra are derived from a sample subjected to a magnetic field having a non-homogeneous component which gives rise to a linear field gradient; each individual spectrum represents a one-dimensional projection of the nuclear spin density in the sample, integrated over planes perpendicular to the direction of the gradient, and in order to obtain two-dimensional or three-dimensional images spectra are derived for a series of different directions of the field gradient and the results are subjected to a process of "image reconstruction". With this method, errors in the magnetic field result in a degradation of the image definition.

The present invention provides a method of investigating a sample using N.M.R. techniques, in which the signal coding principle is utilised in such a way as to enable a variety of kinds of spatially discriminated information to be obtained from the sample, and in particular to enable images to be obtained without incurring the disadvantage discussed above.

The essential features of a method according to the invention consist of subjecting the sample to a magnetic field having a non-homogeneous component which gives rise to a substantially linear field gradient in a given direction relative to the sample, performing on the sample, while it is subjected to said field, a series of operations in each of which nuclear magnetic resonance of a given nuclear species is caused to occur in the sample by irradiating it with at least one pulse of radio frequency energy and data for a given series of epochs in a time domain related to the timing of the irradiating pulse(s) are derived by sampling signals obtained by coherent detection of signals emitted from the sample as a result of the irradiation, the operations of said series differing significantly only by virtue of the magnitude of said gradient having a different value for each operation, and obtaining in respect of the sample information which is spatially discriminated in a dimension corresponding to said given direction by subjecting the data derived from the whole series of operations to processing involving Fourier transformation with respect to the magnitude of said gradient.

It is to be understood that for one of the operations of the series the magnitude of said gradient may have zero value (corresponding to the vanishing of said non-homogeneous component).

The essential features referred to above can be combined in a variety of ways with certain optional features, as is discussed more fully below. It is, however, appropriate first to explain in principle the nature of the information obtainable by subjecting the data derived from a single series of operations as defined above to Fourier transformation with respect to the magnitude of the field gradient, assuming that the magnetic field is uniform apart from the non-homogeneous component referred to above. For this purpose it is convenient to denote by H the value of the magnetic field at a point in the sample, so that for any one operation of the series H is equal to $H_o + gx$, where g is the magnitude of the field gradient for that operation, $H_o$ is the value the field would have in the absence of the non-homogeneous component, and x is the distance of the relevant point from the plane (perpendicular to the direction of the gradient) for which $H = H_o$; for the sake of simplicity it will be assumed for the purpose of the present explanation that neither g nor x takes a negative value. The N.M.R. signal resulting from the presence of the relevant nuclear species at the point in question will thus have an angular frequency equal to $\gamma(H_o + gx)$, where $\gamma$ is the gyromagnetic ratio, and will give rise to a component of the form [A cos ($\gamma gxt$)] in the signals obtained by coherent detection of the signals emitted from the sample. Because of the mathematical equivalence of the variables g and t, it will be seen that the value of this component for particular values of t and g can be regarded either as a sample of a conventional signal in the time domain (for the relevant value of g), or as a sample of a notional signal in a gradient magnitude domain (for the relevant value of t), both signals of course being associated with a specific value of x.

Now consider the data derived by the sampling in the case under discussion, assuming for the sake of simplicity that the coherent detection is effected using only a single phase-sensitive detector. The data will consist of $M \times N$ numbers, where M is the number of operations and N is the number of epochs for which samples are taken in each operation; it is therefore convenient to consider the data as set out in a rectangular matrix having rows respectively corresponding to the different values of g for the series of operations, and columns respectively corresponding to the different values of t for the series of epochs. It will be appreciated that the numbers in each row represent the time domain signal for the relevant value of g, while the numbers in each column represent the gradient magnitude domain signal for the relevant value of t. Conventional Fourier transformation with respect to time would of course involve handling the data row by row, but the present concern is with a method in which the data are handled column by column. In particular, by subjecting the data in each column to Fourier transformation with respect to g one can effectively derive, from the representation of the gradient magnitude domain signal in each column, a representation of a spatial domain signal, in the form of a set of numbers giving the values of the spatial domain signal for different values of x. By appropriate performance of the transformation, these values of x can be made the same for each column; it should be noted that where the well-known fast Fourier transform (F.F.T.) algorithm is employed, this requires the processing to include a change of variable operation, which can be carried out either before or after the application of the F.F.T. algorithm. The transformed data can then be set out in a second rectangular matrix with the columns again corresponding to different values of t, but with the rows now corresponding to different values of x. Thus the rows in the second matrix will respectively represent the time domain signals arising from a series of slices of the sample approximating to planes perpendicular to the direction of the field gradient.

It will accordingly be seen that such a procedure enables N.M.R. measurements (which may be of many different kinds, just as in conventional pulsed N.M.R. experiments) to be carried out with separate results obtained for each of the slices. Merely by way of example, mention may be made of the case in which the irradiating pulses are 90° pulses separated by intervals greater than the spin-lattice relaxation time ($T_1$) and the epochs in the time domain are chosen so that the numbers in each row of the second matrix referred to above will represent the free induction decay signal for the corresponding slice of the sample; in this case the N.M.R. spectrum for each slice can be obtained by subjecting the data in the relevant row of the second matrix to Fourier transformation with respect to t.

The possibility just mentioned constitutes an example of a situation in which the overall processing of the data in a method according to the invention involves both Fourier transformation with respect to the magnitude of the field gradient and Fourier transformation with respect to time. In the foregoing explanatory discussion, it was convenient to assume that in such a situation the transformation with respect to the magnitude of the field gradient would be carried out first; it should be emphasised, however, that this is not essential, since equivalent results can be obtained with the two types of transformation reversed in order.

The preceding discussion explains how it is possible to obtain information which is spatially discriminated in a single dimension. The principles involved can readily be extended to enable spatial discrimination to be effected in two or three dimensions in a method according to the invention, by arranging for the magnetic field to have two or three non-homogeneous components which respectively give rise to substantially linear field gradients in respective directions relative to the sample which are orthogonal to each other, and performing on the sample an appropriate ensemble of operations of the same kind as involved in the one-dimensional case. In the two-dimensional case the ensemble is arranged to constitute a set of series of operations such that the operations of each series differ significantly only by virtue of the magnitude of a first one of the gradients having a different value for each operation and the respective series of the set differ significantly only by virtue of the magnitude of the second of the gradients having a different value for each series; in the three-dimensional case the ensemble is arranged to constitute a group of sets, each of the same kind as involved in the two-dimensional case, such that the respective sets of the group differ significantly only by virtue of the magnitude of the third of the gradients having a different value for each set. It is to be understood that the magnitude of the first gradient may have zero value for one of the operations of each series, that the magnitude of the second gradient may have zero value for one of the series of the or each set and that in the three-dimensional case the magnitude of the third gradient may have zero value for one of the sets of the group. In both cases the processing of the data derived from the whole ensemble of operations will be similar to that appropriate for the one-dimensional case, but the Fourier transformation with respect to the magnitude of the single gradient used in the one-dimensional case will be replaced as appropriate by either two-dimensional Fourier transformation with respect to the magnitudes of the first and second gradients or three-dimensional Fourier transformation with respect to the magnitudes of the first, second and third gradients. As in the one-dimensional case there can thus be derived information representing time domain signals (or frequency domain signals if the data processing also involves Fourier transformation with respect to time) arising from a series of different parts of the sample; in the two-dimensional case these parts will approximate to a two-dimensional array of lines perpendicular to the directions of the two field gradients, and in the three-dimensional case these parts will approximate to a three-dimensional array of points.

In order to use methods according to the invention for obtaining two-dimensional or three-dimensional images of spin density distribution in the sample, the principles involved in the techniques discussed above may be used in conjunction with the known principle of using a linear field gradient while deriving a N.M.R. spectrum so that different spectral frequencies correspond to different positions along the direction of the field gradient. For this purpose the magnetic field is arranged to have two or three non-homogeneous components which respectively give rise to substantially linear field gradients in respective directions relative to the sample which are orthogonal to each other. For two-dimensional imaging two gradients are used and there are performed on the sample a series of operations as in the general one-dimensional case discussed above, i.e. such that the operations of the series differ significantly only by virtue of the magnitude of a first one of the gradients having a different value for each operation; the magnitude of the second of the gradients is thus kept the same for all the operations. By subjecting the data derived from the whole series of operations to processing involving both Fourier transformation with respect to the magnitude of the first gradient and Fourier transformation with respect to time, one can obtain information separately representing the spectra for each of a series of slices of the sample approximating to planes perpendicular to the direction of the first gradient; this information can readily be displayed to provide a two-dimensional image of the spin density distribution in the sample. It should be noted that this image will be a shadow image of the distribution, projected in a direction perpendicular to the directions of the first and second gradients. For three-dimensional imaging three gradients are used and there are performed on the sample a set of series of operations as in the general two-dimensional case discussed above, i.e. arranged so that the operations of each series differ significantly only by virtue of the magnitude of a first one of the gradients having a different value for each operation and the respective series of the set differ significantly only by virtue of the magnitude of a second of the gradients having a different value for each series; the magnitude of the third of the gradients is thus kept the same for all the operations. The treatment of the data in this case is similar to that for the case of two-dimensional imaging, but with Fourier transformation with respect to the magnitude of the first gradient replaced by two-dimensional Fourier transformation with respect to the magnitudes of the first and second gradients, so that the information obtained separately represents the spectra for each of a series of parts of the sample approximating to a two-dimensional array of lines perpendicular to the directions of the first and second gradients.

The imaging techniques just discussed have a significant advantage over methods involving image reconstruction, such as that disclosed by Lauterbur and referred to above. This arises from the fact that when using such techniques errors in the magnetic field give rise to geometrical distortion of the image rather than to a degredation of its definition; for most applications the former is a much less serious fault than the latter.

In some types of method according to the invention it may be appropriate to utilise the spatial selection principle in combination with certain of the techniques discussed above. For example in the case of two-dimensional imaging that principle can be utilised to restrict the relevant signals to those arising from a section of the sample approximating to a plane parallel to the directions of the two field gradients; the image will then represent the spin density distribution in that section, instead of being a shadow image of the whole sample. The spatial selection principle can also be employed in conjunction with the one-dimensional and two-dimensional cases of general N.M.R. measurements discussed above. The spatial selection may be effected by known means, for example by using the type of method disclosed in British Patent Specification No. 1,508,438 and U.S. Pat. No. 4,015,196.

As with conventional pulsed N.M.R. experiments, it may be appropriate, for the purpose of improving the signal-to-noise ratio, to arrange for the irradiation of the sample during each of the operations in a method according to the invention to be in the form of a train of pulses or pulse sequences, with the data derived for each operation being obtained by averaging the values of appropriate sets of samples over the whole train. The use of a train of rapidly recurring pulses during each operation may also be appropriate in order to obtain the benefit of the multiple sideband technique which is utilised in the method disclosed in British Patent Specification No. 1,601,816 and U.S. Pat. No. 4,184,110.

The changes in the magnitude of the magnetic field gradient(s) that must be made in a method according to the invention do not have to be effected with the same order of rapidity as is required in certain known methods employing the signal coding principle. While it will normally be appropriate to maintain the field gradient(s) constant during the performance of each of the operations, with discrete changes of gradient magnitude taking place between successive operations, it is envisaged that in some cases it may be possible to utilise a continuous sweep of gradient magnitude.

An embodiment of the invention will now be described by way of example with reference to the accompanying drawings, in which.

It is assumed that in this embodiment a sample to be investigated contains a non-uniform distribution of water, with a single narrow N.M.R. spectral line resulting from proton resonance. The imaging system is designed to enable two-dimensional images of this distribution to be obtained; as explained more fully below, these images may be either shadow images of the whole sample or images of a section of the sample.

Figure 1:
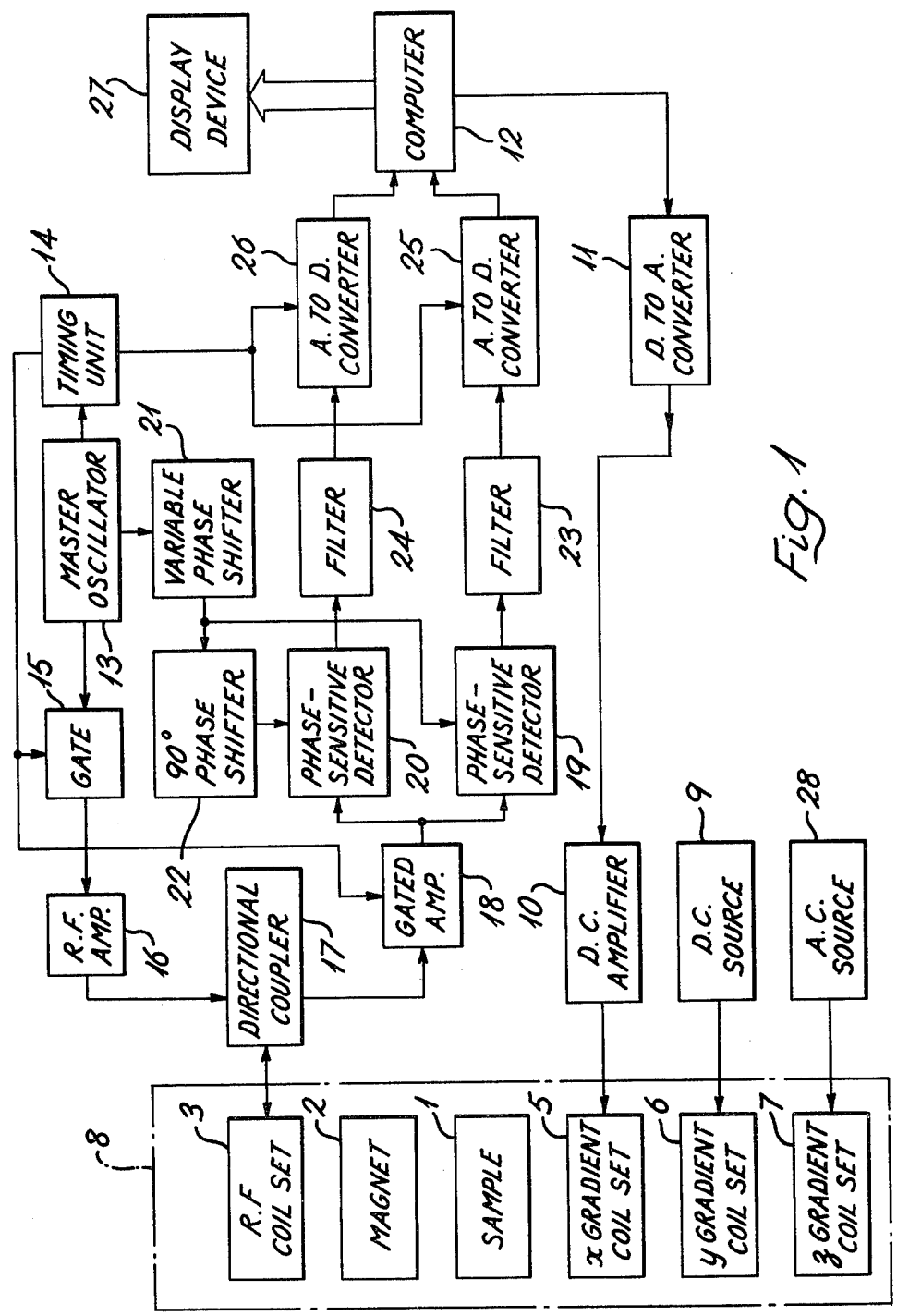
FIG. 1 is a diagrammatic representation of a N.M.R. imaging system in which the principles of the invention are utilised.
Figure 2:
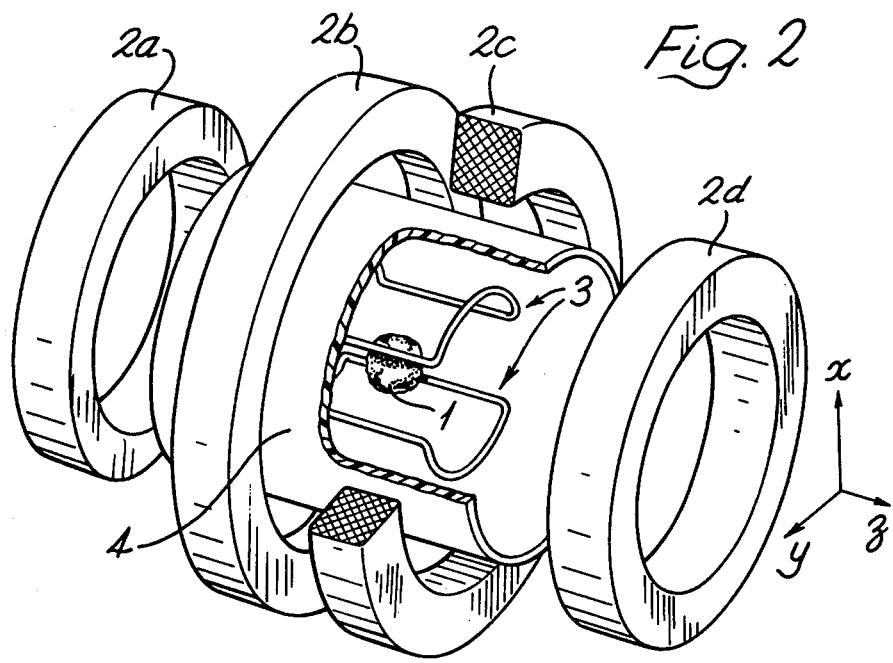
FIG. 2 is a perspective view, partly cut away to show internal details, of part of the structure of the system illustrated in FIG. 1.

Referring to the drawings, the sample (designated 1 in FIGS. 1 and 2) is disposed in a uniform stable magnetic field generated by a magnet 2 which (as shown in FIG. 2) is constituted by a set of four coaxial coils 2a, 2b, 2c and 2d. The value of the magnetic field (subsequently denoted by $H_o$) is chosen to be about 1.2 kilogauss; this corresponds to a proton resonance frequency of about five MHz, since for protons the gyromagnetic ratio is given by $\gamma/2\pi = 4.26$ kHz per gauss. In further considering the geometry of the arrangement, it is convenient to define a Cartesian co-ordinate system with its z axis coincident with the axis of the coils 2a–2d (i.e. parallel to the direction of the magnetic field) and the origin disposed centrally between the coils 2b and 2c. The sample 1 is disposed substantially centrally with respect to the z axis and with the origin lying within it; where a sectional image is required, the sample 1 is located so that the relevant section corresponds to the plane z=0.

Figure 3A:
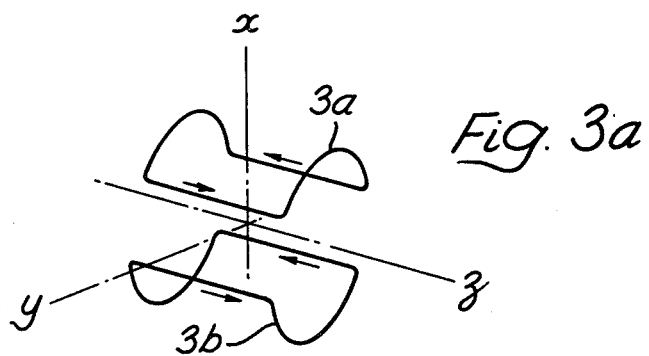
FIGS. 3a, 3b, 3c and 3d are diagrams illustrating the layouts of four coil sets used in the imaging system.

Disposed within the central part of the magnet 2, so as to surround the sample 1, is a coil set 3 for irradiating the sample 1 with radio frequency energy and for picking up N.M.R. signals from the sample 1. The coil set 3 is designed so that the r.f. magnetic field will be directed perpendicular to the z axis; for the sake of definiteness, it is taken that the r.f. magnetic field is directed parallel to the x axis. FIG. 3a more clearly illustrates the layout of the coil set 3, which consists of two similar loops 3a and 3b disposed so as to be mirror images of each other with respect to the plane x=0; each loop 3a or 3b is arranged symmetrically with respect to the plane y=0, and consists of two straight portions extending parallel to the z axis and two arcuate portions lying in planes perpendicular to the z axis which are equidistant from the plane z=0. The loops 3a and 3b are electrically connected in series, with the relative senses of current flow being as indicated by the arrows in FIG. 3a.

Figure 3B:
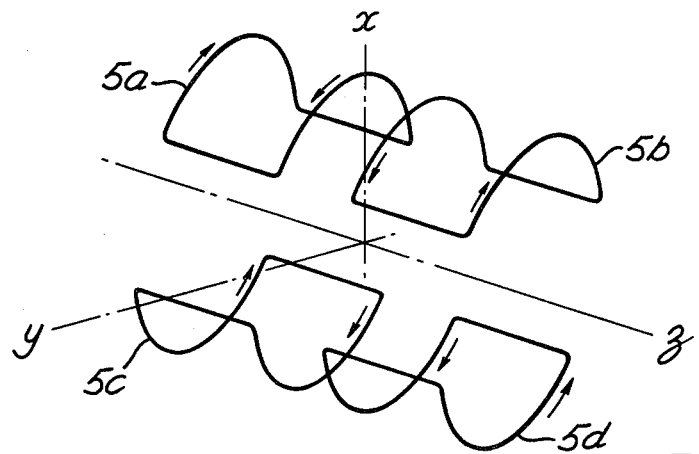
Figure 3C:
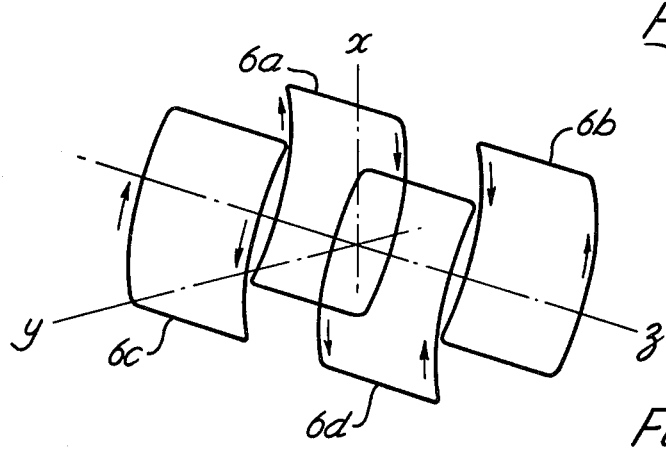
Figure 3D:
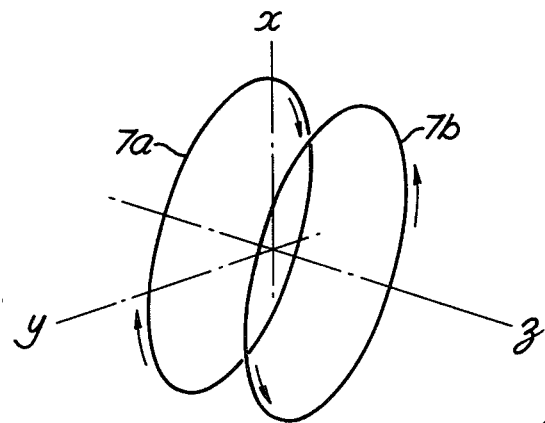

Surrounding the coil set 3 is a tubular former 4 of non-magnetic insulating material, on which are wound three gradient coil sets 5, 6 and 7 for subjecting the sample 1 to non-homogeneous magnetic fields which are superimposed on the main field generated by the magnet 2. For the sake of clarity, the coil sets 5, 6 and 7 are omitted from FIG. 2, but their individual layouts are respectively illustrated in FIGS. 3b, 3c and 3d. These coil sets are so designed that in the vicinity of the origin the field generated by each of them will have a vector component parallel to the z axis, this component having an intensity which varies monotonically with position parallel to one of the axes (x, y and z respectively for the coil sets 5, 6 and 7) but does not vary with position parallel to the other two axes. In other words, the non-homogeneous fields generated by the coil sets 5, 6 and 7 respectively exhibit gradients in the three mutually perpendicular directions parallel to the x, y and z axes; the gradients are required to be substantially linear throughout the sample 1 for the x and y directions, but this is not essential for the z direction. Thus, the coil set 5 consists of four similar loops 5a, 5b, 5c and 5d each of similar shape to the loops 3a and 3b, each of the loops 5a–5d again being disposed symmetrically with respect to the plane y=0 with their straight portions parallel to the z axis; the loops 5a–5d are arranged so that the loop 5a is a mirror image of the loop 5b with respect to the plane z=0 and is a mirror image of the loop 5c with respect to the plane x=0, and the coil 5d is a mirror image of the coil 5b with respect to the plane x=0 and a mirror image of the coil 5c with respect to the plane z=0. The loops 5a–5d are electrically connected in series, with the relative senses of current flow being as indicated by the arrows in FIG. 3b. The coil set 6 is similar to the coil set 5 but with the co-ordinates x and y interchanged. The coil set 7 is in the form of a Helmholtz pair wound in opposition, the coils 7a and 7b of this set being disposed substantially in planes perpendicular to the z axis with their centres lying on that axis, these planes being equidistant from the plane z=0. It will be appreciated that the fields generated by the coil sets 5, 6 and 7 respectively have zero value in the planes x=0, y=0 and z=0.

In deriving an image, a series of operations is performed with the coil sets 5 and 6 energised by undirectional currents, the value of the current supplied to the coil set 5 (and hence the value of the field gradient in the x direction) being different for each operation of the series but the value of the current supplied to the coil set 6 (and hence the value of the field gradient in the y direction) being the same for all the operations. The coil set 7 is utilised only in the case where a sectional image is to be obtained. That case will be considered later, but it will be initially assumed in the following description that a shadow image is to be obtained, so that the presence of the coil set 7 can be ignored. Thus in the shadow image case, for any given operation of the series the component of the total magnetic field parallel to the z axis will have at any point in the sample 1 a value equal to $H_o + gx + hy$, where g is the magnitude of the x gradient for the relevant operation and h is the magnitude of the y gradient; the corresponding resonance frequency will of course be equal to $\gamma(H_o + gx + hy)/2\pi$. It is convenient to take h as positive, but x, y, and g can be either positive or negative. Assuming that the dimensions of the sample 1 are such that $|x|$ and $|y|$ are never greater than L, and that the highest value of $|g|$ for any operation of the series is G, then the maximum and minimum possible values of the resonance frequency in the sample 1 are given by $(\gamma H_o/2\pi) \pm F$, where F is equal to $\gamma(G+h)L/2\pi$.

Referring in particular to FIG. 1 (in which the whole assembly comprising the elements 2–7 is denoted by the general reference 8), the current for the coil set 6 is derived from a d.c. source 9, while the current for the coil set 5 is supplied from the output of a d.c. amplifier 10, the input of the amplifier 10 being connected to the output of a digital-to-analogue converter 11 to whose input there is applied a digital signal generated by a computer 12. Taking the number of operations in the series as 2P, in deriving an image the value of the digital signal is caused to assume in succession 2P different numbers, which together constitute the series running from $-P$ to $P-1$. The value of g can thus be taken as $m\Delta g$, where $\Delta g$ is positive and m is a different one of these 2P numbers for each operation of the series; it will be noted that the value of g is zero for one operation of the series, and that the value of G is equal to $P\Delta g$. The changes in value of the digital signal are arranged to occur at regular intervals, of duration greater than the spin-lattice relaxation time ($T_1$) for the protons in the sample 1; it is of course convenient, but not essential, to arrange for the value of m to be changed by unity in the same sense on each occasion. For many types of sample the duration of the intervals between changes in the value of the digital signal may suitably have a value in the range 0.3–1 second.

As will be explained further below with reference to FIG. 1, for each operation of the series the sample 1 is irradiated with one or more pulses of r.f. energy having a frequency equal to $\gamma H_o/2\pi$, the duration, amplitude and r.f. phase being the same for every pulse throughout the series of operations, and the timing of the pulse(s) relative to the intervals at which the changes in the value of the digital signal occur being the same for all operations of the series. The duration of each pulse is made sufficiently short to ensure that for all operations of the series there is effective irradiation at all possible values of the resonance frequency in the sample 1; this requires the duration of each pulse to be not substantially greater than $\frac{1}{2}$ F. The duration and amplitude of the pulses are chosen so that each pulse gives rise to a rotation of the nuclear magnetisation in the sample 1 of the order of 90°. The resultant N.M.R. signals picked up from the sample 1 are subjected to coherent detection using the phase quadrature detection system. The detected signals will of course contain components at frequencies corresponding to the difference between $\gamma H_o/2\pi$ and the resonance frequencies in the sample 1; the maximum frequency for these components is equal to F. These components will be transient components where the free induction decay technique is used, i.e. where for each operation there is used either a single pulse or a sequence of pulses recurring at intervals greater than $T_1$. Greater efficiency in respect of data collection can, however, be achieved if for each operation there is used a sequence of pulses recurring regularly at intervals which are short compared with the spin-spin relaxation time ($T_2$) for the protons in the sample 1; in this case a quasi-steady state of magnetisation will be set up in the sample 1, and the relevant components in the detected signals will be substantially continuous wave components. In either case, during a period immediately following each pulse the detected signals are sampled at a regular series of epochs defined by $t=n\Delta t$, where t represents time measured from the centre of the duration of the pulse and n is an integer in the series running from one to N (N being even). In order to satisfy the sampling theorem, the sampling interval $\Delta t$ must not be greater than $\frac{1}{2}$ F. A corresponding constraint applies to the magnitude of $\Delta g$, which must be small enough to ensure that for any value of n the sampled data treated as a function of g must not go through more than one cycle when g changes by $2\Delta g$; this requires that $\Delta g$ should not be greater than $\pi/\gamma LN\Delta t$.

The foregoing discussion can be appropriately illustrated by quoting suitable numerical values of the relevant parameters for a specific case. It is assumed for this case that (as would commonly be appropriate in practice) N is chosen to be equal to 2P (i.e. the number of epochs is equal to the number of operations in the series) and h is chosen to be equal to G (i.e. the magnitude of the y gradient is equal to the highest absolute value of the magnitude of the x gradient). From the expressions quoted above, it can be readily deduced that in this case the conditions specified for $\Delta g$ and $\Delta t$ will both be satisfied in the limit by making $\Delta g \Delta t$ equal to $\pi/2\gamma PL$. It is further assumed that the dimensions of the sample 1 in any plane perpendicular to the z axis do not exceed $20 \times 20$ cms, so that the value of L can be taken as 10 cms. The choice of P for a given value of L is dependent on the resolution required in the image; by taking a value of 128 one obtains in this case an image cell size of approximately $0.8 \times 0.8$ mm. Then if a value of 20 microseconds is chosen for $\Delta t$, the specified conditions for $\Delta g$ and $\Delta t$ can be satisfied by making the value of $\Delta g$ equal to 2.29 milligauss/cm. The value of G and h will then be just under 0.3 gauss/cm, with the value of F being 25 kHz. The duration of each pulse can thus also suitably be made equal to 20 microseconds. It will be noted that with these values one obtains a reasonable value of just over five milliseconds for the timing of the last sampling epoch given by $N\Delta t$. In the event that it is desired to use a sequence of rapidly recurring pulses for each operation, the pulse recurrence frequency may suitably be made equal to $\frac{1}{2}N\Delta t$ in this case (giving a value of just under 100 Hz).

Referring again to FIG. 1, the r.f. energy for irradiating the sample 1 is derived from a master oscillator 13 having a frequency equal to $\gamma H_o/2\pi$. An output from the oscillator 13 is fed to a timing unit 14, which generates various timing signals used in the system in response to counting of the cycles of the oscillation. A further output from the oscillator 13 is fed to a gate 15 which is controlled by signals from the timing unit 14, the gate 15 being turned on to produce the required pulses. These pulses are fed to a r.f. power amplifier 16 whose output is applied to the coil set 3 via a directional coupler 17. The N.M.R. signals picked up by the coil set 3 are fed via the directional coupler 17 to a gated low-noise amplifier 18 which is turned off during each r.f. pulse by means of signals derived from the timing unit 14. The output of the amplifier 18 is applied to two identical phase-sensitive detectors 19 and 20, reference signals for which are derived from the oscillator 13; thus, an output from the oscillator 13 is fed to a variable phase shifter 21 and a 90° phase shifter 22 connected in cascade, outputs from the phase shifters 21 and 22 respectively providing the reference signals for the detectors 19 and 20 so that they operate in phase quadrature. The outputs of the detectors 19 and 20 are respectively fed via identical lowpass filters 23 and 24, having a cut-off frequency somewhat above F, to a pair of identical analogue-to-digital converters 25 and 26. The converters 25 and 26 operate, under the control of strobe signals derived from the timing unit 14, to sample the detected signals at the required epochs. The resultant digital signals representing the sampled values are fed to the computer 12 for processing as described below.

In cases where more than one pulse is used for each operation of the series, the first stage of the processing involves addition of the sampled values epoch by epoch for each operation, to provide an average value for each epoch for each operation. This stage is of course not required where only a single pulse is used for each operation. In any case, there will thus be available a set of 2PN pairs of numbers, with the numbers of each pair respectively corresponding to the two signal channels; in the further processing the numbers of each pair are respectively treated as the real and imaginary parts of a complex number which it is convenient to denote by $S_{mn}$, where the subscripts m and n respectively indicate the relevant operation and the relevant epoch. The data constituted by the 2PN complex numbers are subjected to Fourier transformation with respect to the magnitude of the x gradient. To effect this there are calculated the values of the complex numbers $f_{rn}$ given by the expression $$f_{rn} = n \sum_{m=-P}^{P-1} S_{mn} \exp(-i\gamma n \Delta t m \Delta g r \Delta x)$$

for all values of n from one to N and for all values of r from $-P$ to $P-1$, with $\Delta x$ equal to $L/P$. The calculation can be speeded up by using the fast Fourier transform algorithm, but in this event a change of variable operation must also be performed. The data constituted by the 2PN complex numbers $f_{rn}$ are then subjected to Fourier transformation with respect to time. To effect this there are calculated the values of the complex numbers $F_{rs}$ given by the expression $$F_{rs} = \sum_{n=1}^{N} f_{rn} \exp(-i\gamma n \Delta t h s \Delta y)$$

for all values of r from $-P$ to $P-1$ and for all values of s from $-N/2$ to $N/2-1$, with $\Delta y$ equal to $2L/N$. The data constituted by the 2PN complex numbers $F_{rs}$ are then processed by an algorithm, of the type used in conventional N.M.R. experiments, to make any necessary corrections in respect of the signal phases. The real (in-phase) component of the final data, corresponding to an absorption mode spectrum, is retained, while the imaginary (out-of-phase) component, corresponding to a dispersion mode spectrum, is discarded. There is thus obtained a set of 2PN real numbers $A_{rs}$, which respectively represent (each for a value of x equal to $r\Delta x$ and a value of y equal to $s\Delta y$) the water content of the sample 1 integrated through the sample 1 in the z direction. These numbers are utilised to control the operation of a display device 27 so as to generate the required shadow image. The device 27 may for example incorporate a storage cathode ray tube operated so as to produce a rectangular array of $2P \times N$ points whose brightnesses are respectively set in accordance with the numbers $A_{rs}$.

Turning now to consider the alternative case in which a sectional image is to be obtained, in this case a sequence of rapidly recurring pulses is used for each operation of the series, and the coil set 7 is energised with a sinusoidal audio frequency current derived from an a.c. source 28 so as to generate a systematically varying field gradient in the z direction. It will be appreciated that with this arrangement for each operation of the series the total magnetic field strength is substantially invariant with time in a thin slice of the sample 1 approximating to the plane z=0, but varies significantly with time at all points in the sample 1 outside this slice; within the slice the component of the total magnetic field parallel to the z axis will of course have a value the same as that quoted above for the shadow image case, i.e. equal to $H_o+gx+hy$. The effective thickness of the slice will vary inversely with the amplitude of the current supplied to the coil set 7, and can for example be made about two mm if the current is such that the peak value of the z gradient is of the order of 0.1 gauss/cm. The frequency of the current supplied to the coil set 7 is chosen so that in the parts of the sample 1 other than the selected slice there is a significant change between consecutive ones of the intervals between the pulses in the average value of the magnetic field during each interval; this implies that there should not be synchronism or a low order harmonic relationship between the pulse recurrence frequency and the frequency of the current supplied to the coil set 7. The latter can, for example, suitably have a value of about 70 Hz where the pulse recurrence frequency has a value of about 100 Hz, as in the specific case referred to above.

In all other respects the derivation of the sectional image is the same as is described above for the shadow image case, with the first stage of the data processing of course involving the derivation of an average value of the sampled signals for each epoch for each operation. By effecting the averaging over a substantial number of periods of the systematic variation of the z gradient field, any contributions to the received N.M.R. signals arising from resonance effects in the parts of the sample 1 outside the selected slice will be effectively smoothed out, so that the averaged data will correspond only to the resonance effects in the selected slice. As a result the set of numbers $A_{rs}$ will in this case effectively represent the distribution of water only within the selected slice.

As noted above, imaging techniques such as have been described with reference to the drawings have the advantage that field errors will show up as shifts of position in the final image, rather than causing a degradation of definition. The magnitude of the positional errors that can be tolerated in the image will determine the degree of uniformity required in the fields generated by the magnet 2 and the coil sets 5 and 6. For any given system, the magnitudes of the errors can be calculated from plots of the relevant fields, and can if required be corrected during the data processing by appropriate shifting of values in the set of numbers $F_{rs}$.

It should be noted, however, that from a consideration of the expression given above for $f_{rn}$, it can be seen that the spatial resolution distance of the distribution along the x direction decreases as n increases. The relatively worse spatial resolution for small values of n gives rise to an artifact in the image, this effect being associated with the fact that in deriving the image use is made of a field gradient which has the same magnitude for all the operations. The artifact is similar to those observed with methods involving image reconstruction, such as that disclosed by Lauterbur, in cases where data is collected for a range of directions of the field gradient extending over an angle of less than 180°. The artifact can be reduced by reducing the value of h relative to G.

I claim:
1. A method of investigating a sample, the method comprising:
   subjecting the sample to a magnetic field having a non-homogeneous component which exhibits a substantially linear field gradient in a given direction relative to the sample;
   performing on the sample, while it is subjected to said field, a series of operations in each of which nuclear magnetic resonance of a given nuclear species is caused to occur in the sample by irradiating the sample with at least one pulse of radio frequency energy and in each of which data for a given series of epochs in a time domain related to the timing of the irradiation are derived by sampling signals obtained by coherent detection of signals emitted from the sample as a result of the irradiation, the operations of said series differing substantially only by virtue of the magnitude of said gradient having a different value for each operation; and
   obtaining in respect of nuclei of said species in the sample information which is spatially discriminated in a dimension corresponding to said given direction by subjecting data derived from the whole series of operations to processing involving Fourier transformation with respect to the magnitude of said gradient.
2. A method according to claim 1, in which:
   said field is arranged to have two non-homogeneous components which respectively exhibit first and second substantially linear field gradients in respective directions relative to the sample which are orthogonal to each other;
   there are performed on the sample, while it is subjected to said field, an ensemble of operations in each of which nuclear magnetic resonance of a given nuclear species is caused to occur in the sample by irradiating the sample with at least one pulse of radio frequency energy and in each of which data for a given series of epochs in a time domain related to the timing of the irradiation are derived by sampling signals obtained by coherent detection of signals emitted from the sample as a result of the irradiation, said ensemble constituting a set of series of operations such that the operations of each series differ substantially only by virtue of the magnitude of said first gradient having a different value for each operation and the respective series of the set differ substantially only by virtue of the magnitude of said second gradient having a different value for each series; and
   said information is obtained by subjecting data derived from the whole ensemble of operations to processing involving two-dimensional Fourier transformation with respect to the magnitudes of said first and second gradients.
3. A method according to claim 1, in which:
   said field is arranged to have three non-homogeneous components which respectively exhibit first, second and third substantially linear field gradients in respective directions relative to the sample which are orthogonal to each other;
   there are performed on the sample, while it is subjected to said field, an ensemble of operations in each of which nuclear magnetic resonance of a given nuclear species is caused to occur in the sample by irradiating the sample with at least one pulse of radio frequency energy and in each of which data for a given series of epochs in a time domain related to the timing of the irradiation are derived by sampling signals obtained by coherent detection of signals emitted from the sample as a result of the irradiation, said ensemble constituting a group of sets of series of operations such that the operations of each series differ substantially only by virtue of the magnitude of said first gradient having a different value for each operation, the respective series of each set differ substantially only by virtue of the magnitude of said second gradient having a different value for each series and the respective sets of the group differ substantially only by virtue of the magnitude of said third gradient having a different value for each set; and said information is obtained by subjecting the data derived from whole ensemble of operations to processing involving three-dimensional Fourier transformation with respect to the magnitudes of said first, second and third gradients.

4. A method according to claim 1, 2 or 3, in which the processing of the data also involves Fourier transformation with respect to time.

5. A method according to claim 1, in which:

said field is arranged to have two non-homogeneous components which respectively exhibit to first and second substantially linear field gradients in respective directions relative to the sample which are orthogonal to each other, the operations of said series differing substantially only by virtue of the magnitude of said first gradient having a different value for each operation, the magnitude of said second gradient being the same for all the operations of the series; and said information is obtained by subjecting data derived from the whole series of operations to processing involving both Fourier transformation with respect to the magnitude of said first gradient and Fourier transformation with respect to time.

6. A method according to claim 5, in which:

said field is arranged also to have a systematically varying non-homogeneous component such that for each operation of the series the field is substantially invariant with time in a section of the sample approximating to a plane parallel to the directions of said first and second gradients but varies significantly with time in all other parts of the sample;

the irradiation of the sample for each operation is in the form of a sequence of rapidly recurring pulses, the duration of said sequence corresponding to a substantial number of periods of the variation of said systematically varying component and the frequency of said variation being such that there is a significant change between consecutive ones of the intervals between said pulses in the average value of said field during each interval; and the derivation of data for each of said series of epochs involves obtaining an average value in respect of the whole sequence of pulses for a set of samples respectively taken at corresponding points after the individual pulses of the sequence.

7. A method according to claim 1, in which:

said field is arranged to have three non-homogeneous components which respectively exhibit first, second and third substantially linear field gradients in respective directions relative to the sample which are orthogonal to each other;

there are performed on the sample, while it is subjected to said field, an ensemble of operations in each of which nuclear magnetic resonance of a given nuclear species is caused to occur in the sample by irradiating the sample with at least one pluse of radio frequency energy and in each of which data for a given series of epochs in a time domain related to the timing of the irradiation are derived by sampling signals obtained by coherent detection of signals emitted from the sample as a result of the irradiation, said ensemble constituting a set of series of operations such that the operations of each series differ substantially only by virtue of the magnitude of said first gradient having a different value for each operation and the respective series of the set differ substantially only by virtue of the magnitude of said second gradient having a different value for each series, the magnitude of said third gradient being the same for all the operations of the ensemble; and said information is obtained by subjecting data derived from the whole ensemble of operations to processing involving both two-dimensional Fourier transformation with respect to the magnitudes of said first and second gradients and Fourier transformation with respect to time.

8. A method of investigating a sample, comprising:

subjecting the sample to a magnetic field having a non-homogeneous component which exhibits a substantially linear field gradient in a given direction relative to the sample;

performing on the sample, while it is subjected to said field, a series of operations each of which involves:
  (a) irradiating the sample with at least one pulse of radio frequency energy to cause nuclear magnetic resonance of a given nuclear species to occur in said sample,
  (b) coherently detecting signals emitted from the sample as a result of the irradiation, and
  (c) deriving data for a given series of epochs in a time domain related to the timing of the irradiation by sampling signals obtained by (b), the operations of said series differing substantially only by virture of the magnitude of said gradient having a different value for each operation; and obtaining in respect of the sample information which is spatially discriminated in a dimension corresponding to said given direction by subjecting the data derived from the whole series of operations to processing involving Fourier transformation with respect to the magnitude of said gradient.

* * * * *